United States Patent [19]

Harari

[11] 4,449,224
[45] May 15, 1984

[54] DYNAMIC MERGED LOAD LOGIC (MLL) AND MERGED LOAD MEMORY (MLM)

[76] Inventor: Eliyahou Harari, 2320 Friars La., Los Altos, Calif. 94022

[21] Appl. No.: 220,491

[22] Filed: Dec. 29, 1980

[51] Int. Cl.³ .................... H01L 27/04; H01L 29/78; G11C 11/40
[52] U.S. Cl. ......................... 377/79; 357/23; 357/24; 357/30; 307/446; 365/149
[58] Field of Search ............ 307/446, 452, 453, 481; 357/41, 23 C, 23 S, 42, 30, 24 R, 24 LR; 377/79; 365/78, 149, 150, 203

[56] References Cited

U.S. PATENT DOCUMENTS

| | | | |
|---|---|---|---|
| 3,601,627 | 8/1971 | Booher | 307/453 |
| 3,621,292 | 11/1971 | Vogel et al. | 307/446 |
| 3,662,356 | 5/1972 | Michon et al. | 357/23 C |
| 3,683,201 | 8/1972 | Haraszti | 307/446 |
| 3,740,576 | 6/1973 | Haraszti | 307/453 |
| 3,745,370 | 7/1973 | Kjar | 307/481 |
| 3,788,904 | 1/1974 | Haraszti et al. | 307/446 |
| 3,829,710 | 8/1974 | Hirasawa et al. | 307/452 |
| 4,190,778 | 2/1980 | Krause | 307/315 |
| 4,319,263 | 3/1982 | Rao | 357/23 S |
| 4,329,706 | 5/1982 | Crowder et al. | 357/23 S |

OTHER PUBLICATIONS

Crawford, MOSFET in Circuit Design, (McGraw-Hill, N.Y., 1967) pp. 100–101, 104–105.

Primary Examiner—William D. Larkins
Attorney, Agent, or Firm—Alan H. MacPherson; Richard Franklin; Steven F. Caserza

[57] ABSTRACT

MOS dynamic logic/shift registers employing as load elements either a parasitic bipolar transistor whose emitter is the drain of the MOS element, or the drain-substrate diode charged via bi-polar signals on the clock lines capacitively coupled to the drain. Uses for logic, memory, and imaging applications.

41 Claims, 22 Drawing Figures

(CELL 200a)

(CELL 200a)

(CELL 200b)

(CELL 300a)

| | DIFFUSION |
| --- | --- |
| | BURIED CONTACT |
| | POLYSILICON |
| | CONTACT |
| | METAL |
| | ISOLATION |

TABLE I

| EVENT | CLOCK PHASE | $V_{IN}$ | $V_1$ | $V_2$ | $V_3$ | $V_{OUT}$ |
|---|---|---|---|---|---|---|
| 1 | $\phi_{1a,1b}$ AT $t_3$ | H | L | – | – | – |
| 2 | $\phi_{2a,2b}$ AT $t_3$ | – | L | H | – | – |
| 3 | $\phi_{1a,1b}$ AT $t_3$ | L | H | H | L | – |
| 4 | $\phi_{2a,2b}$ AT $t_3$ | – | H | L | L | H |
| 5 | $\phi_{1a,1b}$ AT $t_3$ | H | L | L | H | H |
| 6 | $\phi_{2a,2b}$ AT $t_3$ | – | L | H | H | L |
| 7 | $\phi_{1a,1b}$ AT $t_3$ | H | L | H | L | L |
| 8 | $\phi_{2a,2b}$ AT $t_3$ | – | L | H | L | H |
| 9 | $\phi_{1a,1b}$ AT $t_3$ | – | – | H | L | H |
| 10 | $\phi_{2a,2b}$ AT $t_3$ | – | – | – | L | H |

H = HIGH ($V_X$)
L = LOW (0)
– = EITHER HIGH OR LOW (DOES NOT MATTER)

TABLE II

| EVENT | CLOCK PHASE | $V_1$ | $V_2$ | $V_3$ | $V_4$ | $V_5$ | $V_6$ | $V_{OUT}$ |
|---|---|---|---|---|---|---|---|---|
| 1 | PRECHARGE | H | H | H | H | H | H | H |
| 2 | INTEGRATE | H | H | L | L | L | H | – |
| 3 | CLEAR ($\phi_{2a,2b}$) | H | L | L | H | L | H | – |
| | BEGIN DATA SHIFTING ($V_{IN}$ GROUNDED = L) | | | | | | | |
| 4 | $\phi_{1a,1b}$ | H | L | H | H | L | H | L |
| 5 | $\phi_{2a,2b}$ | H | L | H | L | L | H | L |
| 6 | $\phi_{1a,1b}$ | H | L | H | L | H | H | L |
| 7 | $\phi_{2a,2b}$ | H | L | H | L | H | L | L |
| 8 | $\phi_{1a,1b}$ | H | L | H | L | H | L | H |
| 9 | $\phi_{2a,2b}$ | H | L | H | L | H | L | H |
| 1 | BEGIN NEW PRECHARGE CYCLE | | | | | | | |

ALL $\phi_{1a,1b}$ AND $\phi_{2a,2b}$ ARE AT THE END OF $t_3$
H = HIGH
L = LOW
– = EITHER STATE (DOES NOT MATTER)

DYNAMIC MERGED LOAD LOGIC (MLL) AND MERGED LOAD MEMORY (MLM)

BACKGROUND OF THE INVENTION

1. Field of the Invention

The present invention relates to new dynamic logic elements which are more compact than prior art elements and which have substantially more drive capability for charging up successive output stages.

2. Description of the Prior Art

The basic prior art logic element is an inverter having a switching (driver) transistor and a pullup (load) device which is either a passive resistor or diode, or an active transistor which in a dynamic circuit is periodically clocked to conserve power. A typical prior art structure of this type is disclosed, for example, in U.S. Pat. Nos. 3,471,712 and 3,668,424. In the '712 patent, a logic circuit is disclosed employing a pair of field effect transistors each of which is connected in series with a non-linear constant voltage load element. Other similar logic structures are disclosed in U.S. Pat. No. 3,395,291 issued July 30, 1968 on an application of Bogert and U.S. Pat. No. 3,393,325 issued July 19, 1968 on an application of Borror et al.

Dynamic (multiphase) logic is a well established concept, both in logic applications and in serial (shift register) type memory applications. A good description of dynamic MOS inverters and gates is given in the book *"IC in Digital Electronics"* (Barna and Porat, 1973). Related prior art U.S. patents are U.S. Pat. Nos. 4,107,548 by Sakaba et al. (Ratioless Type MIS Logic Circuit), 3,702,945 by Faith et al (MOS Circuit with Nodal Capacitor Predischarge Means), 4,040,015 by Fukuda et al. (Complementary MOS Logic Circuit), 4,017,741 by Briggs et al. (Dynamic Shift Register Cell), 3,651,334 by Thompson (Two Phase Ratioless Logic Circuit with Delayless Output), 3,838,293 by Shah (Three Clock Phase, Four Transistor Per Stage Shift Register), and 3,601,627 by Booher (Multiple phase logic gates for shift register stages) showing a four phase shift register (FIG. 4).

The basic four phase ratioless prior art shift register is shown in FIG. 1. Transistor 102 is the load device, transistor 101 is the switching device, and transistor 103 is the transfer device. When $\phi_1$ is taken high with $\phi_2$ low (for an NMOS implementation) capacitor $C_1$ (104) is charged high. If $V_{in}$ is high, $C_1$ is discharged to ground when $\phi$'is brought low and $\phi_2$ is pulsed high. If $V_{in}$ is low $C_1$ remains charged high for a period of time measured in several milliseconds at room temperature. Normally node 106 is at ground potential, but in some implementations it is connected to the $\phi_1$ clock so that no DC power is dissipated when $\phi_1$ is brought high. All prior art dynamic logic devices share a common substrate which is normally tied to ground or to a negative potential (VBB) for NMOS implementation.

The structure shown in FIG. 1 represents a full stage of a shift register. To operate properly as a shift register, two half stages are required, each having their own two clock phases, with $\phi_3$, $\phi_4$ of the second half stage corresponding to clock phases $\phi_1$, $\phi_2$ of the first half stage. A full clock cycle consists of $\phi_1 + \phi_2 + \phi_3 + \phi_4$.

Each of the above structures uses a loading element separate from the logic elements. Accordingly, the densities of these structures are inherently limited by the minimum number of components required in the logic. Thus, regardless of cell size, the minimum packing density is equal to the number of devices in a chip times the size of each device.

SUMMARY OF THE INVENTION

The logic element in the present invention merges the switching transistor and load device of the prior art into a single element, thereby at least doubling the device density. I call this new form of logic element "Merged Load Logic" or "MLL". The basic MLL inverter concept can be extended to other logic gate functions such as NAND or Nor gates.

In accordance with this invention, MLL lends itself to implementing high density serial shift register memories (which I call "Merged Load Memories" or "MLM") which can be clocked to store N bits of data on N+1 MLL inverter stages, where N is a selected integer. Furthermore these serial memories can combine basic storage with logic operations such as addition, multiplication, data compression data delay, etc., all using the same basic MLL element clocked synchronously in a pipeline architecture. MLL can also be implemented such that the initial state, when powered up, is predetermined through a custom masking step, providing therefore a serial ROM (read only memory) array.

Various embodiments incorporating structures in accordance with my invention are disclosed herein, including MLL inverters, NAND gates, NOR gates and ROM inverters. In addition, various serial architectures for mass memory storage and digital data manipulation in accordance with my invention are disclosed, including the use of MLL in a serial shift register used as an optical detector.

BRIEF DESCRIPTION OF THE DRAWING

FIG. 2b is a circuit schematic of a half stage of an MLL two-input NAND gate of the four clock phase type shown in FIG. 2a.

FIG. 2c is a circuit schematic of a half stage of an MLL two-input NOR gate of the four clock phase type shown in FIG. 2a.

FIG. 3b is a circuit schematic of a half stage MLL two-input NAND gate of the type shown in FIG. 3a.

FIG. 3c is a circuit schematic of a half stage MLL two-input NOR gate of the type shown in FIG. 3a.

FIG. 3f is an equivalent circuit for the charge pump mechanism of the cell in FIG. 3a.

Table I demonstrates the time events for serially clocking digital data in an MLL serial shift register chain.

Table II demonstrates the time events for converting optical patterns to digital patterns and then serially clocking the collected data in an MLL serial detector/shift register chain.

DETAILED DESCRIPTION OF THE INVENTION

MLL With Merged Bipolar Load

Figure 1:
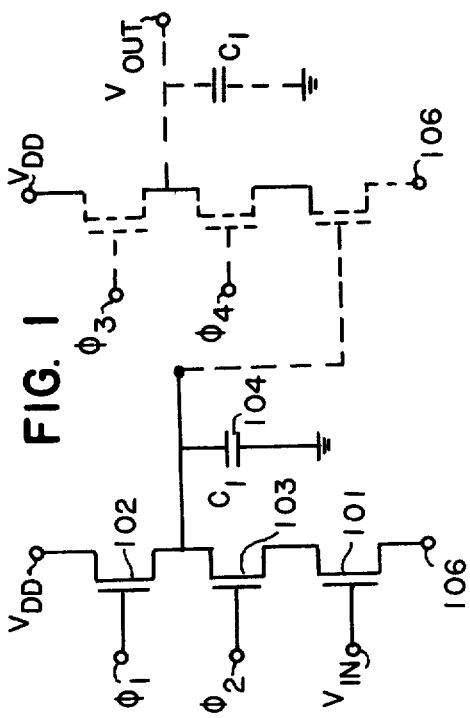
FIG. 1 is a circuit schematic of a prior art dynamic four phase register wherein all transistor substrates are at ground or VBB potential.
Figure 2C:
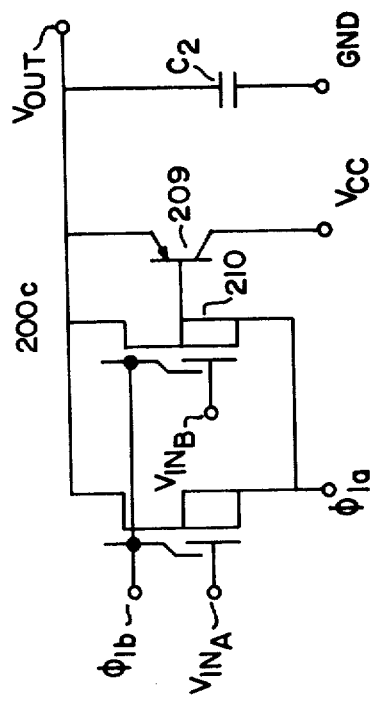
Figure 2B:
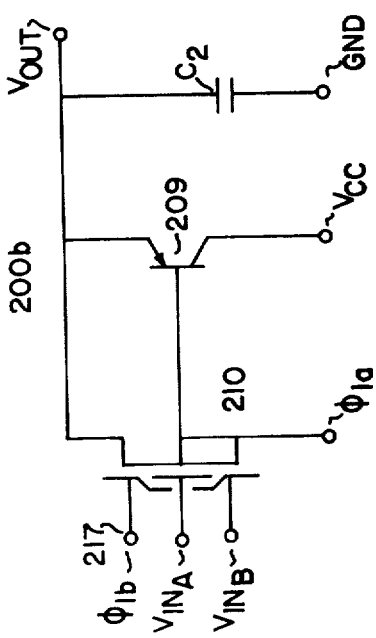

Cell 200a (FIG. 2a) is a basic inverter gate in accordance with this invention. Transistor 201 is the switching device controlled by the input signal $V_{in}$. Transistor 201 is in series with transistor 203, the transfer device controlled by the clock signal $\phi_{1b}$. Both NMOS transistors 201 and 203 share the same P− substrate and can have their gates overlapped as shown in FIG. 2a. The P− substrate 212 is electrically tied to the N+ source diffusion 206, which is connected to clock phase $\phi_{1a}$. Contrary to prior art devices the P− substrate for a given MLL cell is junction isolated from the P− substrates of other MLL cells. Each inverter stage in a chain is constructed with an isolated P− well in an N− substrate. The N− substrate, however, is shared with other cells in a column of a serial memory array, in which case all cells in the column are clocked at the same time by $\phi_{1a}$. Cells in adjacent columns share other isolated P-wells, with each well and its corresponding N+ source diffusion tied to either the $\phi_{1a}$ or $\phi_{2a}$ clock lines. The necessity for isolating the P-well of the MOS transistors 201 and 203 from the P-wells of other similar transistor pairs stems from that well being also the base region of a vertical NPN bipolar load transistor, 209. Bipolar transistor 209 uses the N-type substrate as collector 208 common to all cells such as cell 200a in the array. The N− substrate is usually held at the most positive potential, $V_{cc}$. The emitter 202 on the other hand is the same N+ diffusion as forms the drain of MOS transistor 203, and is junction isolated by the P-well (or P-base) from all other cells.

Figure 2D:
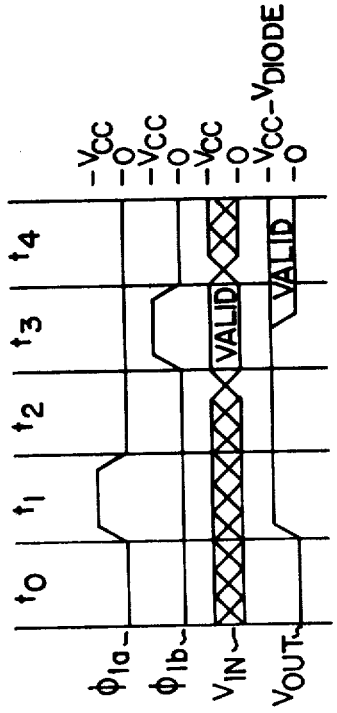
FIG. 2d is a clocking scheme for the half stage shift register of FIG. 2a, showing two clock phases $\phi_{1a}$, $\phi_{1b}$ out of the four clock phases ($\phi_{1a}$, $\phi_{1b}$, $\phi_{2a}$, $\phi_{2b}$) necessary to properly propagate data through two consecutive half stages in a single clock cycle also showing when $V_{in}$ data must be valid and when $V_{out}$ data becomes valid.
Figure 2A:
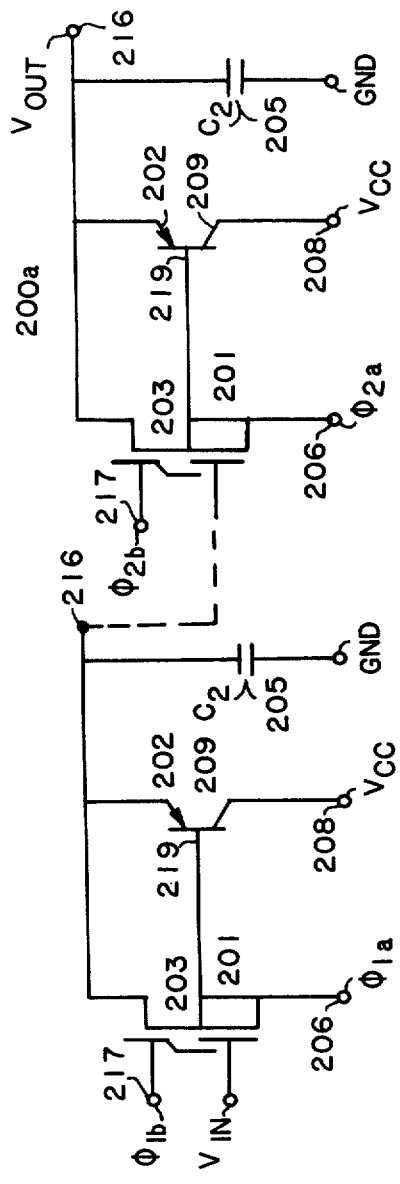
FIG. 2a is a circuit schematic of a full stage of a four phase MLL shift register network having four clock phases $\phi_{1a}$, $\phi_{1b}$, $\phi_{2a}$, $\phi_{2b}$ and with merged vertical bipolar load for charging output capacitor $C_2$ which is the input of the next half stage.
Figure 2E:
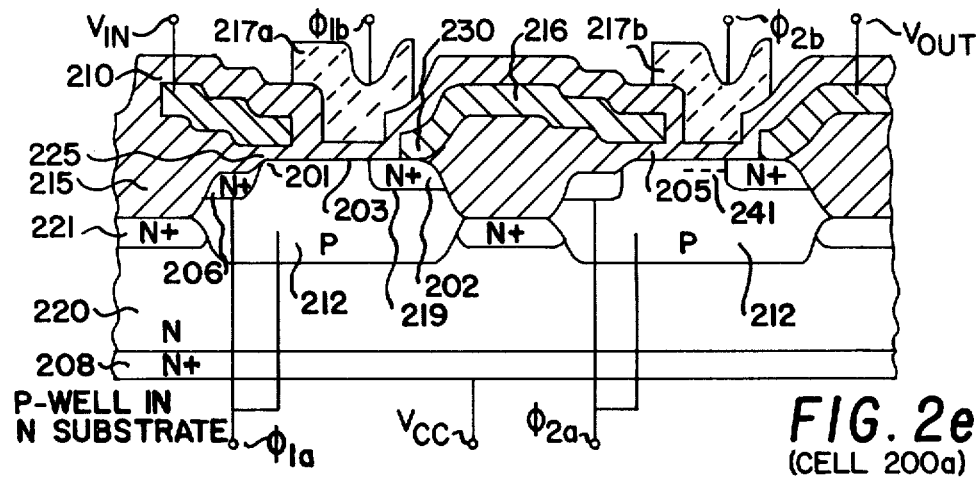
FIG. 2e is a cross-sectional view of two MML inverter stages of the type shown in FIG. 2a in series, constituting one single data storage element in a four phase clocking scheme ($\phi_{1a}$, $\phi_{1b}$, $\phi_{2a}$, $\phi_{2b}$), implemented in NMOS silicon gate technology, with isolated P-wells in an N-substrate.
Figure 2F:
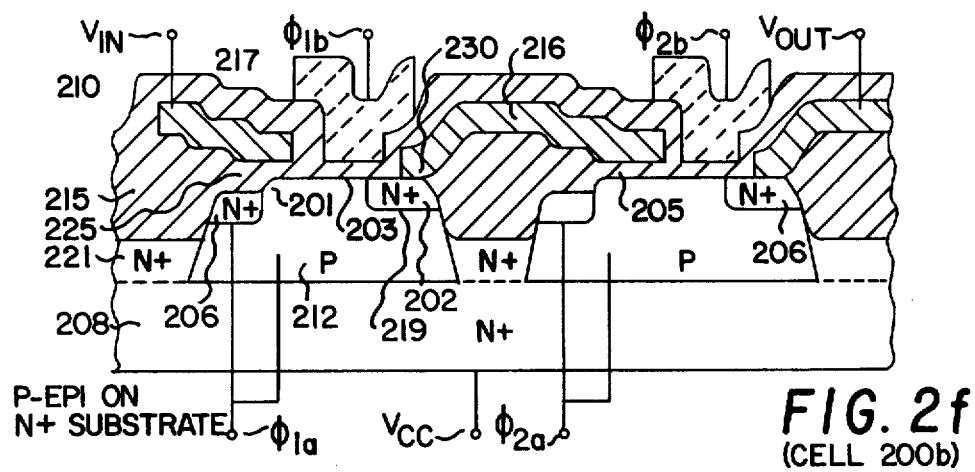
FIG. 2f is a cross-sectional view of two MML inverter stages of the type shown in FIG. 2a in series, constituting one single data storage element in a four phase clocking scheme ($\phi_{1a}$, $\phi_{1b}$, $\phi_{2a}$, $\phi_{2b}$), implemented in NMOS silicon gate on epitaxial silicon with a common buried collector layer to form efficient vertical NPN load devices.

Cross-sectional views of two implementations of this embodiment are shown in FIGS. 2e and 2f. In FIG. 2e (cell 200a) the isolated P-wells 212 are formed in a standard manner by, for example, diffusing P-type wells into an N-type substrate 220. Isolation between adjacent cells is achieved by selective field oxidation 215 known in the art as isoplanar (see, for example, U.S. Pat. No. 3,648,125) or coplaner oxidation. N+ channel stop regions 221 are formed in a well-known manner underneath the field oxide. These N+ regions reduce the resistance of the N substrate (common collector) region and improve the electrical isolation between adjacent P-wells 212. N+ source diffusions 206 are formed in the P-wells and a gate oxide 205 is grown. Direct contacts (known as buried contacts) 230 are then etched in the gate oxide 205 through to the substrate, where the output drain (collector) N+ diffusion 202 will be formed. This diffusion is formed by first depositing on the surface of the wafer a layer of polysilicon (from which will be formed "output lead-gate" 216), then doping this polysilicon with phosphorus or arsenic with sufficient drive so as to form a good N+P junction 219 in the P-well 212. The extent of lateral spread of N+ diffusion 202 is controlled by the dimensions of the buried contact opening. The polysilicon layer is then defined and etched to form polysilicon gates such as gate 216. It is evident from FIG. 2e that the polysilicon through the direct contact 230 takes the output lead 216 of one inverter stage into the gate input of the next stage. The polysilicon is then dielectrically isolated with a relatively thick thermal oxide 210 or a CVD dielectric. It is preferable to have as thick a dielectric 210 as possible because it reduces capacitive coupling between polysilicon gates 216 and the clock lines 217 formed in a second conductive level above dielectric 210. This second layer, typically formed of an appropriate conductive material, such as aluminum, is deposited and etched to form the second set of gates (such as gate 217a associated with transistor 203). Clock phase $\phi_{1a}$ is electrically strapped to both N+ source diffusion 206 and its corresponding P-well 212 (both source 206 and P-well 212 are therefore kept at the same potential) while clock phase $\phi_{1b}$ is connected to gate 217a. In order to reduce the area taken up by strapping N+ sources and P-wells it is desirable to have several inverters share the same N+ source diffusion and the same P+ substrate so that not every individual inverter need have this strapping. Typically the inverters are layed out in columns, with a common N+ source column and a common P-well where the two are electrically strapped and contacted to the $\phi_{1a}$ clock line every k cells, where k is an integer such as 8 or 16.

The implementation in FIG. 2f (cell 200b) is similar to that in FIG. 2e except that the isolated P-wells 212 are formed by growing a P-type epitaxial layer on an N+ substrate 208 and then performing selective isoplanar oxidation 215 all the way down to the N+ substrate (common collector 208). This implementation is more difficult to manufacture but has the advantage of a very low impedance $V_{cc}$ supply available everywhere on the chip since 208 is normally tied to $V_{cc}$. In both cells 200a and 200b the oxide 225 over the N+ source diffusions is usually thicker than the gate oxide 205 due to enhanced thermal oxidation rate of N+ silicon compared to lesser doped silicon. This is a desirable effect because it minimizes the parasitic capacitance of the output stage by increasing the oxide thickness over the N+ source region.

FIGS 2e and 2f each show two inverter stages connected in series, with the output of one stage forming the input of the next stage. Each stage is shown to have its own clock phases: $\phi_{1a}$, $\phi_{1b}$ for the first stage and $\phi_{2a}$, $\phi_{2b}$ for the second stage. In a normal shift register operation all odd inverter stages would be clocked by the same $\phi_{1a}$, $\phi_{1b}$ clocks while all even stages would be clocked by the same $\phi_{2a}$, $\phi_{2b}$ clocks. In its simplest form, normal shift register operation requires four clock phases $\phi_{1a}$, $\phi_{1b}$, $\phi_{2a}$, $\phi_{2b}$ during a single clock cycle to propagate the stored data by one shift register stage.

The principle of operation of a single half stage of cells 200a and 200b is explained by following the clocking scheme shown in FIG. 2d. Initially (t=t$_0$), $\phi_{1a}$, $\phi_{1b}$ are low, $V_{in}$ is either high ($V_{cc}$) or low (zero volts) and $V_{out}$ is not valid. At t=t$_1$, $\phi_{1a}$ is taken high. This forward biases the PN+ junction 219 and also provides base current for the NPN emitter follower 209 (FIG. 2a) (N=208, P=212, N=202). This charges the output lead 216 (C$_2$ in FIG. 2a comprises gate oxide capacitance 205) to ($V_{cc}$-$V_{diode}$). No DC power is dissipated since the N+ source diffusion 206 is raised to $V_{cc}$ together with the P-base 212 since the two are strapped together to the $\phi_{1a}$ clock line. Time t=t$_2$ is the time interval between $\phi_{1a}$ going down and $\phi_{1b}$ coming up to $V_{cc}$. During this time the output C$_2$ remains charged high. The input voltage $V_{in}$ must be established before $\phi_{1b}$ goes high at t=t$_3$. Once $\phi_{1b}$ is high a discharge path is established to the N+ source 206 which is now at ground potential ($\phi_{1a}$). C$_2$ is discharged if $V_{in}$ (controlling MOS transistor 201) is high and remains high (i.e., charged at a voltage given approximately by $V_{cc}$-$V_{diode}$) if $V_{in}$ is low. Note that proper operation is established if the high and low voltage levels on $V_{in}$ and $V_{out}$ are only several tenths of a volt above and below the threshold voltage of transistor 201, respectively. $V_{out}$ data becomes valid during t=t$_4$ when $\phi_{1b}$ goes low at the end of t$_3$. t$_3$ should be sufficiently long to allow proper discharge of C$_2$. Typically all clock phases t$_i$ can be as short as a few nanoseconds, and the full clock cycle (t$_1$+t$_2$+t$_3$+t$_4$) should not be longer than several milliseconds, the time required between refresh at room temperature.

Cells 200a and 200b have a marked advantage in circuit density over prior art dynamic inverters because the NPN load device consumes no surface area by virtue of being vertically merged with the surface NMOS switching transistor. Not only is the inverter area substantially reduced, but the NPN load can provide substantially greater drive capability to rapidly charge load capacitance C$_2$ (one plate of which comprises conductive lead 216), which is made possible because of the ratioless nature of cells 200a and 200b (that is, switching NMOS transistor 203 and load bipolar transistor 209 are never both on at the same time).

Yet another density advantage is attained from the use of the N+ source diffusion 206 both as the ground line and as a low impedance line to reduce the P-base resistance when $\phi_{1a}$ goes high (the P-base has a relatively high sheet resistance but is electrically strapped to the low resistance N+ source diffusion). Thus as described above, the N+ source diffusion 206 extends along the semiconductor device (perpendicular to the plane of the drawing shown in FIG 2e) and serves as a relatively low resistance conductive path to transmit the potential of the $\phi_{1a}$ clock to the various cells such as cell 200a containing N+ source diffusion 206 as a part thereof. As explained above, electrical contact to N+ source 206 is made in a well-known manner by forming contact vias for ohmic contacts from the top surface of the structure and connecting conductive ohmic contact regions (not shown) to both N+ source region 206 and to P base region 212. These ohmic contact regions are then interconnected to bring source 206 and base 212 to the same potential. These contacts are made in a well-known manner and thus are not described herein. Other circuit density advantages can be derived from the availability of the $V_{cc}$ supply (particularly for cell 200b) under the entire array. The $V_{cc}$ supply is connected to N+ region 208 by any of a variety of standard techniques such as by using a standard well-known collector sink for this purpose, or by contacting the substrate from the back.

The availability of the $V_{cc}$ supply and the high drive capability of the bipolar load can be extremely useful in dynamic logic applications with large arrays of uncommitted gates or logic arrays formed by interconnecting macrocells from a set of standard logic gate functions. Because of the semi-random nature of placement of these macrocells, long interconnect lines are required, necessitating high drive capability, which prior art dynamic MOS loads do not possess. Various logic functions can be formed using the basic inverter (cell 200a, FIG. 2a), Nand gate (cell 200b, FIG. 2b) and Nor gate (cell 200c, FIG. 2c) of the present merged load logic invention. The additional input gates provide a series path (nand) or a parallel path (Nor) to discharge the output stage during t=t$_3$.

MLL With Merged Charge Pumped Diode Load

Figure 3A:
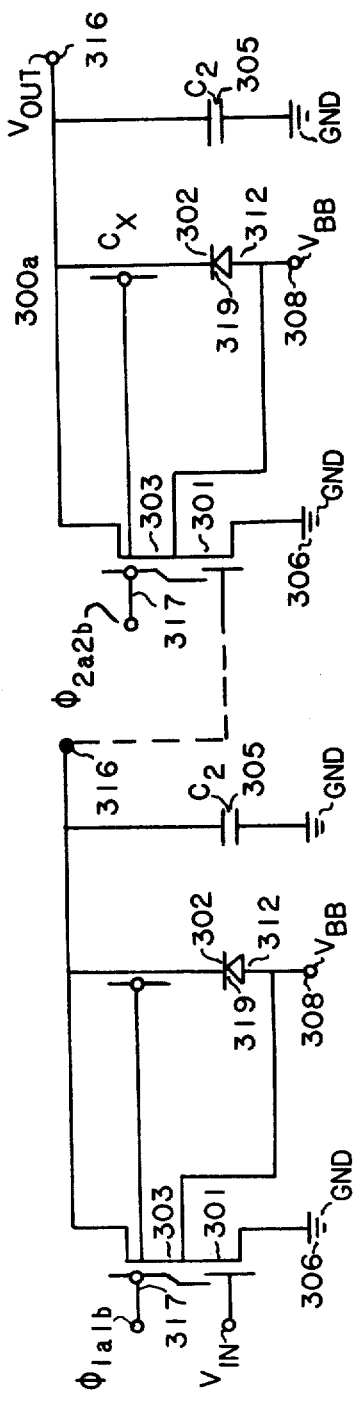
FIG. 3a is a circuit schematic of a full stage MLL dynamic four phase shift register with merged diode load tied on one terminal to the substrate and on the other capacitively coupled to the clock line for charge pumping output capacitor $C_2$.
Figure 3E:
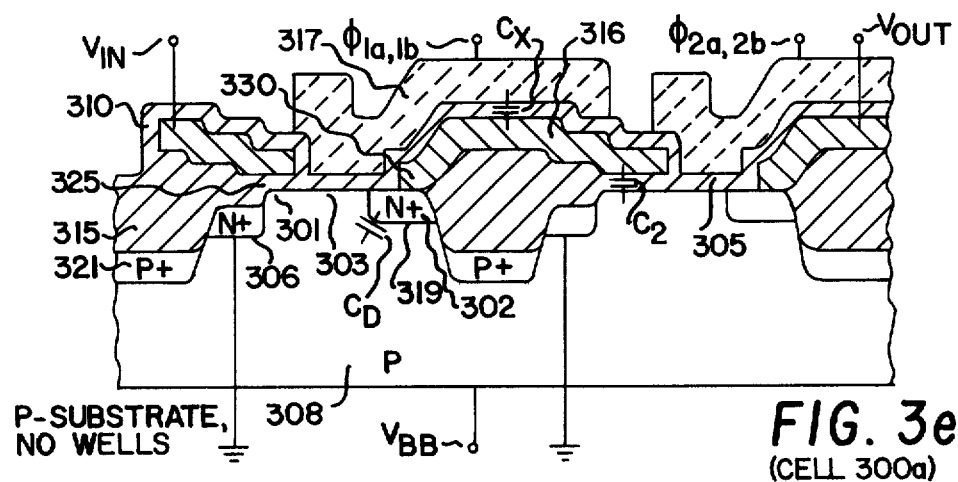
FIG. 3e is a cross-sectional view of two MLL inverter stages of the type shown in FIG. 3a in series, together constituting one single data storage element in a four phase clocking scheme, implemented in a NMOS silicon gate technology.

The requirement for isolated P-wells 212 in cells 200a and 200b is eliminated in an alternative embodiment of MLL, shown schematically in FIG. 3a (cell 300a) and in cross-section in FIG. 3e. From the cross-section view it is evident that all cells in the array now share a common substrate 308, which is held at a fixed potential, $V_{BB}$ (ground or negative voltage). Two other unique features of cell 300a are that the source diffusions 306 are connected to ground rather than to the $\phi_{1a}$ clock, and that both clock phases $\phi_{1a}$ and $\phi_{1b}$ are applied through the same interconnect line 317. This greatly simplifies layout of dense logic or serial memory arrays. As will be explained below, line 317 goes negative ($\phi_{1a}=-V_p$ as shown in FIG. 3d where $V_p$ is a negative voltage) to achieve charging of the output C$_2$ through charge pumping, and it goes positive ($\phi_{1b}=V_{CC}$) as in cells 200a, 200b to achieve discharge of $C_2$. The three voltage levels ($V_{cc}$, O, $-V_p$) are generated on the chip in a well-known manner from a two level supply (e.g., a supply with $V_{cc} = +5V$ and OV can generate $V_p = -3V$ on the chip). Alternatively three voltage levels are generated using potential dividers on the chip (e.g., $V_{cc} = +5V$, "O" = +2.5V, $V_p = OV$).

The basic MLL inverter 300a is similar to cells 200a and 200b in having the same switching transistor 301 and transfer transistor 303, but is different in not having an NPN vertical bipolar load. Instead each output stage is charged to a high voltage state $V_x$ through charge pumping from the common substrate. In a sense the inverter does not have a load device per se. Instead the inverter uses the clock line 317 to capacitively forward bias the N+P drain junction 319 during the period when $\phi_{1a}$ is more negative than $V_{BB}$ by at least a diode drop. (Junction 319 may also be a Schottky diode, formed by suitable choice of electrode material for conductive lead 316.)

Construction of MLL embodiment 300a is simpler than that of 200a and 200b because there is no need for the formation of isolated P− substrates or an epi layer, nor is there a requirement for electrically strapping together N+ source diffusions with their P-type wells. Furthermore the N+ source diffusions can be formed deeper (and therefore of lower impedance) without concern for shorting with other N+ source regions (such as potential shorting between regions 206 and 221 in cells 200a, FIG. 2a). As shown in the cross-section of cell 300a, FIG. 3e, field oxide isolation 315 is used to prevent sneak parasitic transistor leakage paths between adjacent cells. The gate oxide 305, the buried contacts 330 and the polysilicon gates 316 are formed in a manner similar to that described for cells 200a and 200b. However, contrary to cells 200a and 200b, the dielectric layer 310 of cell 300a is now made as thin as is practical without formation of electrical shorts, or a dielectric of high dielectric constant is used. The purpose of dielectric 310 is to drastically increase capacitive coupling $C_X$ between the clock electrode 317 and the output electrode 316, which in turn is capacitively coupled to the substrate through junction 319 capacitance $C_D$. The relative values of $C_X$, $C_D$, and all other parasitic capacitances surrounding electrode 316 will determine the maximum voltage attainable on it during the charge pumping operation. For the purpose of minimizing the parasitic capacitances, the oxide 325 over the N+ source diffusion 306 can be grown substantially thicker than the gate oxide 305. Then the only remaining significant parasitic capacitance is $C_2$, formed by output electrode 316 and the substrate 308 across gate oxide 305. The three capacitances influencing the charge-pumped voltage $V_X$ on the output electrode 316 are shown in an electrical equivalent circuit in FIG. 3f. During charge pumping when $\phi_{1a}$ is brought to voltage $V_p$ which is more negative than substrate voltage $V_{BB}$ by at least a diode drop, the N+P diode 319 becomes forward-biased and its capacitance $C_D$ greatly increased. Charge is instantaneously injected from the substrate into the N+ region of electrode 316. The amount of charge depends on the voltage difference ($V_p - V_{BB}$), so that $V_{BB}$ is an effective control of the voltage level $V_X$ on electrode 316 attained by charge pumping, and hence is an effective control of the power dissipation during a charge/discharge cycle. When $\phi_{1a}$ goes back to the "0" state (equal to or more positive than $V_{BB}$) the excess charge remains on the N+P junction 319 which is now reverse biased. It will remain so until leakage and generation-recombination current will neutralize it, typically in several milliseconds at room temperature. This excess charge determines the conduction state of transistor 301 of the succeeding stage if there is sufficient charge on electrode 316 to take $V_X$ above the 301 transistor threshold voltage. Typically this threshold voltage is +0.5V to +1.0V, whereas $V_X$ is given approximately by the expression $$V_X = \frac{V_{BB}(C_2 + C_D) + C_X V_p}{C_X + C_2 + C_D} \qquad \text{Eq. (1)}$$

Typically the device should be constructed so that $$C_X \approx 2C_2 \approx 6C_D$$

when $C_D$ is measured for the reverse bias junction condition. For the case of $V_{BB} = OV$ and $V_p = -5V$ we have from Eq. (1):

$$V_X = 3.0V,$$

clearly more than enough to maintain the 301 transistor of the output stage in a conducting (high) state when electrode 317 is either at OV or at any more positive voltage. Thus the charge pumping operation achieves the purpose of raising the voltage on the output stage $C_2$ without the need for a separate load device as in all prior art dynamic inverters.

The principle of operation of cell 300a as a dynamic inverter stage can be explained using the pulse diagram FIG. 3d. Initially ($t=t_0$) the clock line ($\phi_{1a,1b}$) is low, $V_{in}$ is either high ($V_{cc}$) or low (OV), and $V_{out}$ is invalid. At $t=t_1$ the clock lead 317 is taken negative ($V_p$), initiating charge pumping of the output 316. Time interval $t=t_2$ is the time interval for the clock to go from a voltage more negative than $V_{BB}$ to a voltage more positive than the threshold voltage of transfer transistor 303. It is also the time interval during which the input voltage $V_{in}$ must become valid, at OV or $V_{cc}$. During interval $t_2$ the output capacitance $C_2$ remains charged in the high state (excess positive charge on the junction isolated electrode 316). During time interval $t=t_3$, $\phi_{1a,1b}$ is high and $V_{in}$ is valid for a period sufficiently long to allow the flow of electrons from the 306 source diffusion through the series transistors 301 and 303 to neutralize the excess charge on the output capacitance $C_2$. This occurs, however, only if the voltage $V_{in}$ on the input gate is high ($V_{cc}$), whereas if it is low (zero volts) no discharge path exists between electrode 316 and ground 306. In this latter situation, the output capacitance $C_2$ will remain charged, a condition which is detected through the low impedance state of the channel formed by electrode 316 and gate oxide 305. Data out ($V_{out}$) becomes valid ($V_X$ or zero volts) towards the end of time interval $t_3$. During time interval $t=t_4$, $V_{in}$ can change since $\phi_{1a,1b}$ is back at zero volts, shutting off the discharge path to ground. We see that a high $V_{in}$ (that is $V_{in} > V_{301\ threshold}$) during time interval $t=t_3$ results in an inverted low output ($V_{out} = OV$) during time interval $t=t_4$ while a low $V_{in}$ (zero volts) during time interval $t=t_3$ results in a high $V_{out}$ (i.e., $V_X$) during time interval $t=t_4$. All clock phases $t_i$ can be as short as a few nanoseconds, and the full clock cycle ($t_1+t_2+t_3+t_4$) should not be longer than 1 to 2 milliseconds (approximately 1 Khz clock). In its simplest form, normal shift register operation requires two half stages per data site and therefore a propagation of data through one complete shift register stage requires four clock phases $\phi_{1a, 1b}$, $\phi_{2a, 2b}$ and a full propagation clock cycle has a duration of $2(t_1+t_2+t_3+t_4)$.

Figure 3C:
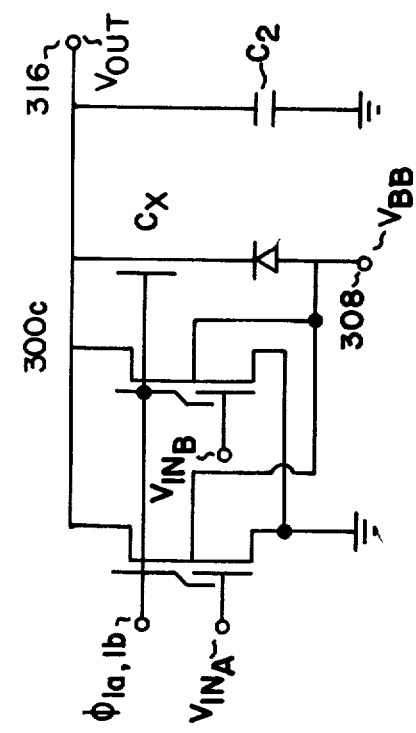
Figure 3B:
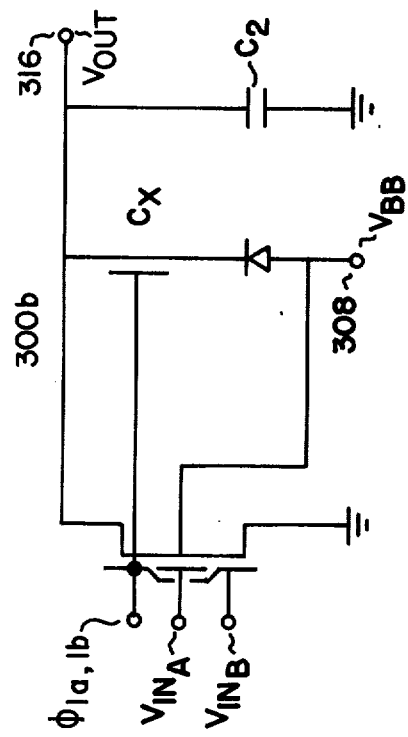
Figure 3F:
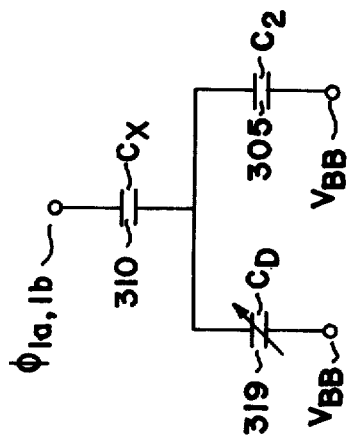
Figure 3D:
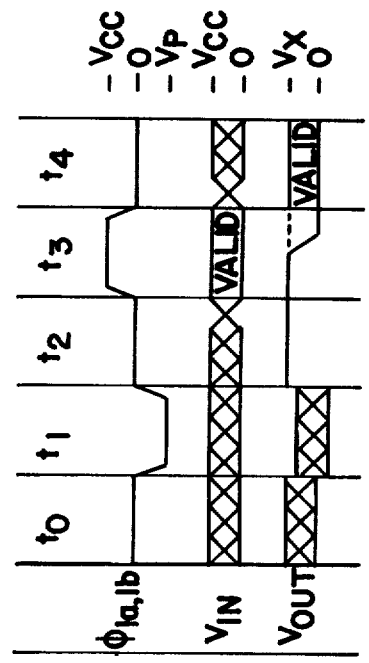
FIG. 3d is the clocking scheme for the half stage shift register of FIG. 3a, showing two clock phases $\phi_{1a}$, $1b$ out of the four clock phases ($\phi_{1a}$, $1b$, $\phi_{2a}$, $2b$) necessary to properly propagate data through two consecutive half stages in a single clock cycle, also showing when $V_{in}$ data must be valid and when $V_{out}$ data becomes valid.

A two-input Nand gate 300b and a two-input Nor gate 300c are shown schematically in FIGS. 3b and 3c, respectively. The clock line is the same as for the single input inverter while the second input "B" for both types of gates is used to provide part of the discharge path to the source (ground) diffusion (i.e., a series path for the NAND gate and a parallel path for the NOR gate).

The charge pumped MLL cell 300a is ideally suited for high density memory applications such as for serial shift register digital memory storage. It is not well suited for applications where the output has a very large capacitance $C_2$ (which is difficult to charge pump to a sufficiently high voltage $V_X$ on electrode 316) or a leaky output. In a serial memory array capacitance $C_2$ is relatively low, being substantially the input capacitance of the next inverter stage along the line (that is, a fanout of one). Apart from the simple device structure of MLL cell 300a it also provides the benefit of extremely low power dissipation, which becomes important in large arrays of serial shift-register memories. For example, at a minimum clock cycle of 1 Khz (standby storage in a circulating shift register memory) the power dissipation in a minimum geometry inverter stage driving a fanout of one is given approximately by $$P = CV^2 f \approx 10^{-14} \times 3^2 \times 10^3 \approx 10^{-9} \text{ watt/bit.}$$

Serial Merged Load Memory (MLM) Array Implementations a. Comparison with CCD Memories

All three MLL cell types 200a, 200b and 300a described above lend themselves to similar layouts in dense serial memory arrays. Prior art serial memory organizations developed for CCD (Charged Coupled Device) memories apply to the Merged Load Memory (MLM), with approximately the same circuit density as for CCD structures but with distinct advantages over CCDs for digital signal processing and storage. One important distinction between CCD serial memories and serial merged load memories should be noted. Thus, CCD serial memories are principally analog shift registers whereas serial MLM are purely digital in nature. That is, CCD memories operate by shifting an injected charge packet along several hundred gate elements and detecting the presence or absence of this packet at the output sense amplifier stage. The amplitude of this charge packet is changed during propagation due to surface or bulk generation recombination or spike currents, requiring periodic sensing and refreshing of the peopagating series of charge packets. In the MLM serial memory the charge packet is automatically refreshed at *each* stage with each clock cycle, with the next following stage down the chain acting as the sense amplifier of the previous stage, as will be shown in detail below. The advantage of this serial storage mode is that the data is purely digital (0 and 1 states only) and the transfer mechanism is insensitive to charge transfer inefficiency which has traditionally afflicted CCD memories. The digital nature of data transfer also lends itself to digital signal processing and data manipulation of the stored data. For example, stored data can be shifted serially in 8 or 16 parallel channels of MLM inverter chains and at any desired location in the chain the outputs can be inputted for the purpose of logic manipulations into a series of NAND or NOR gates of the type shown in FIGS. 2a, 2b, 3b and 3c, all clocked with the same $\phi_{1a}$, $\phi_{1b}$ clocks as for the serial shift register chains. In this way pipelined signal processing can take place—the shifted data can be added, added to, substrated, delayed, compressed, etc. and then passed into the next input stage of the serial storage chain. This flexibility allows, for example, for error detection and correction codes to be integrated onto the storage chain. By contrast CCD type shift registers can only manipulate charge packets by comparing with a reference charge packet—a tedious technique for signal processing applications. Because of this comparison with a reference charge packet CCD input stages must use accurate charge metering techniques (such as "fill and spill" techniques). In contrast, the input stage on any serial MLM need only have a potential several tenths of a volt above (high) or below (low) the input transistor threshold voltage, and the same is true for the input of any subsequent stage (which is the output of the previous stage). Because MLL inverters in a serial storage chain do not require the presence of a periodic sense amplifier (or a refresher circuit) in the chain it is possible to fabricate not only extremely long storage chains, say 16,000 bits long, but also relatively short, say 16 bits short, without incurring the penalty of having numerous sense amplifiers decrease circuit density. For example, a 64,000 bit array can be constructed as 4000 randomly accessed words, each word consisting of a 16 bit circulating storage chain. If this type array were to be implemented with CCD storage it would require 4000 sense amplifiers, one for each storage chain. In the MLM implementation no sense amplifiers are required, except for one at the output buffer stage.

A further advantage of serial MLM over CCD storage comes in soft error protection against alpha particles and other spurious ionizing radiation effects. The digital nature of MLM storage makes it more immune to these particles and effects than the analog CCD signal. Furthermore, in the implementation of cells 200a and 200b (FIGS. 2a and 2b) the bias conditions during operation are such that the P-well and P-base 212 (FIG. 2e) collects very little charge from an incident ionizing particle, most of the charge being collected in the N substrate 220.

It is also important to note that all MLL inverter implementations (FIGS. 2e, 2f and 3e) require successive stages in a serial chain to be electrically isolated from each other, usually by a strip of dielectric isolation. By constrast CCD serial chains rely on a potential barrier established electrically in the silicon, there being no channel-stop or oxide isolation in the direction of data flow (any such would destroy the charge transfer efficiency or the potential barriers required for device operation). Because of this basic difference in construction and operation serial MLM chains are immune to effects of overflow and blooming commonly found in CCDs, which in the case of an alpha particle bit can affect several bits in a CCD serial memory, but at most affect only a single bit in a serial MLM array. The same considerations apply in the use of MLL for digital optical sensors, an application which will be further described below in a later section.

All MLL cell embodiments are amendable to pipelined logic architecture since data manipulation occurs only once during each clock cycle. Therefore no race conditions can occur, a result which greatly simplifies logic design.

b. Clocking for Serial Memory Transfer

Figure 4:
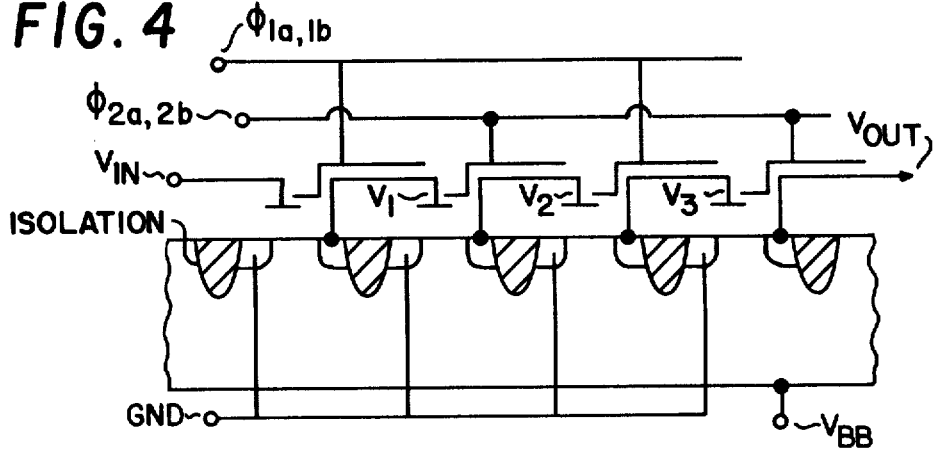
FIG. 4 is a schematic representation of four inverter half stages of the type shown in FIG. 3e connected in series to form a serial shift register chain clocked by two clock lines.

Despite the difference in device operation between all MLL embodiments on the one hand and prior art Charge Coupled Devices (CCD) or Bucket Brigade Devices (BBD) on the other hand, many of the concepts developed for CCD and BBD circulating storage memories can be applied to MLM circulating serial storage memories. Before describing several serial MLM organizations the basic scheme for serial data transfer will be demonstrated using a chain of four inverters of type 300a shown in FIGS. 3a and 3e. Similar transfer clocking schemes apply to cells 200a and 200b. There are two basic clock transfer schemes: in the first, the storage of each bit requires two inverter stages and two clock phases ($\phi_{1a,1b}$ applied to all odd numbered inverters and $\phi_{2a,2b}$ applied to all even numbered inverters). In the second, up to N bits can be stored on N+1 inverter stages, and N+1 clock passes are required (each phase $\phi_{1a,1b}$ applied to a single inverter stage). The second scheme results in an increased storage density at the penalty of increased clock complexity and reduced data transfer rate. Only the first clock transfer scheme will be described here. Assume for the sake of illustration that the data to be transferred (shifted) through the four inverter stages is 1101 or HHLH, with the right hand bit (least significant bit or "LSB") entering the chain first—see FIG. 4 for the schematic of the four inverter stages and Table I for the chain of events in time as the data propagates down the line. As shown in FIG. 4, clock line $\phi_{1a,1b}$ is common to the first and third inverters while clock $\phi_{2a,2b}$ is common to the second and fourth inverters. A full clock cycle consists of ($\phi_{1a,1b}+\phi_{2a,2b}$), where $\phi_{1a,1b}$ and $\phi_{2a,2b}$ are each taken successively through their $t_0$, $t_1$, $t_2$ and $t_3$ periods as described previously in conjunction with the clock diagram of FIG. 3d (it is assumed that the data out becomes valid before the end of $t_3$, and so $t_4$ effectively coincides with $t_0$). The principle of data transfer in such that data propagates through two successive inverter stages during each complete clock cycle. Table I shows voltage levels $V_i$ at each output electrode of the four inverters at the end of time interval $t=t_3$ of the respective phases shown on the lefthand column. The first bit (H) into the array is introduced by applying a high voltage ($V > V_{threshold}$) to $V_{in}$ during time interval $t_2$ of event #1(clock phase $\phi_{1a,1b}$). At the end of $t_3$ of the same clock phase this data is inverted and appears as $V_1=L$ on the second stage. During the second clock phase $\phi_{2a,2b}$ of the first clock cycle this L is further inverted and transferred to the third stage, where it shows up as $V_2=H$ (event #2). During event #3 the next bit (L) is inputted into $V_{in}$ ($V < V_{threshold}$) while the data in the third stage is again inverted and transferred to the fourth stage ($V_3=L$). At the end of two full clock cycles (event #4) the first bit is out ($V_{out}=H$). A full clock cycle later (event #6) the next bit (L) appears at $V_{out}$, and so on. The $V_{in}$ data must be valid during time interval $t_2$ of the $\phi_{1a,1b}$ clock phase while the $V_{out}$ data is valid between the end of time interval $t=t_3$ of $\phi_{2a,2b}$ and the end of time interval $t=t_1$ of $\phi_{2a,2b}$ on the next clock cycle.

In a circulating memory the $V_{out}$ electrode is electrically connected to the $V_{in}$ electrode so that once a string of binary data is introduced it can be made to continuously circulate through the inverter chain.

In the second scheme for data propagation data moves down the inverter chain by clocking a vacancy through the chain in the direction opposite to the data flow. The data transfer rate is slower because to move one bit through a single inverter stage requires a longer clock cycle, the clock cycle now being ($\phi_{1a,1b}+\phi_{2a,2b}+\cdots+\phi_{Na,Nb}+\phi_{(N+1)a,(N+1)b}$).

c. Serial MLM Organizations

Figure 5A:
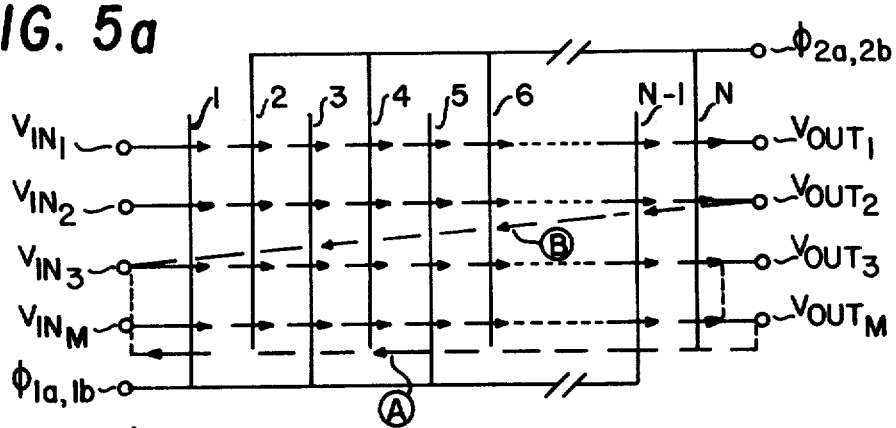
FIG. 5a is a schematic representation of a serial shift register memory array using MLL inverters for basic shift register elements.
Figure 5B:
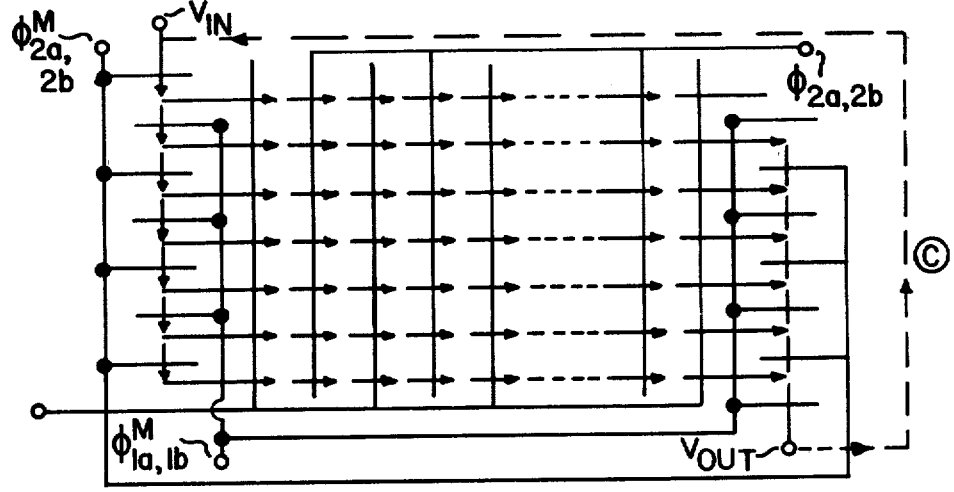
FIG. 5b is a schematic representation of a serial shift register memory array with "serial in-parallel transfer-serial out" organization using MLL inverters for basic shift register elements.
Figure 5C:
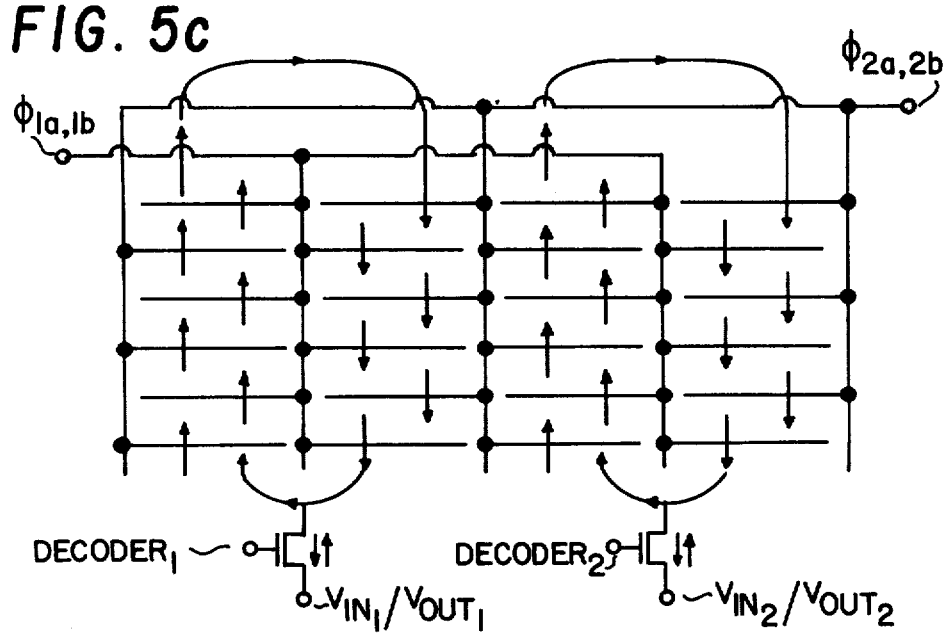
FIG. 5c is a schematic representation of a serial shift register memory array with a "loop" organization where each loop is randomly accessed. MLL inverters are used for basic shift register elements.

There are several memory organizations for implementing high density dynamic shift register storage using any of the MLL cells 200a, 200b or 300a (shown in FIGS. 2a, 2b and 3a, respectively). Some of these organizations and their respective advantages have been demonstrated in CCD and magnetic bubble serial memory arrays. For any of the three different MLL cell types, memory organization depends on the length of the shift register chain required which directly affects the maximum access time (known as latency). FIGS. 5a to 5c show schematically three different organizations for serial data transfer. FIG. 5a shows an organization where there are M chains, each of N inverter stages, with common clock lines shared by columns of M inverters each. Data is shifted in parallel, M bits at each clock cycle. The output lead of each of the M chains may be tied to its own input (A) to provide a circulating memory, or to the input (B) of another chain to double the length of the serial chain (the output from this second chain can be connected to the input of the first chain to give a circulating memory of twice the bit storage capacity).

FIG. 5b shows a serial in, parallel transfer, serial out (SPS) organization used also in high density CCD memories. Data is inputted through a serial chain clocked at a high frequency (by the $\phi_{1a,1b}{}^M$, $\phi_{2a,2b}{}^M$ clocks) then transferred into the parallel section so that the serial input chain can again be inputted with new data. The opposite occurs at the output serial chain. The output can again be electrically connected to the input by means of lead "C" shown as a dashed line to form a circulating storage element. This very high density implementation can be operated with low power because of the relatively low frequency of clock transfers in the parallel mode of operation ($\phi_{1a,1b}$, $\phi_{2a,2b}$), but it has a relatively high latency.

A third organization which provides a relatively fast access time (low latency) is shown in FIG. 5c. Data is circulated in short loops (the loops shown are 12 inverter stages long), each of which can be accessed randomly through external decoders, or serially using another loop (the former is known as LARAM for CCDs, the latter is known as major/minor loops for magnetic bubbles).

Other memory organizations are made possible by the flexibility afforded by the fact that the stored data is refreshed each clock cycle and by the lack of requirement for any complex sense amplifiers. As has been pointed out previously it is possible to break the inverter chains at any point and have the data stream manipulated through a series of NAND or NOR gates clocked with the same $\phi_{1a,1b}$ and $\phi_{2a,2b}$ clock phases. Effectively this makes it possible to have "intelligent memories" where logic operations are performed on the data while it undergoes propagation along the dynamic shift register storage chain.

ROM (Read Only Memory) Implementation in MLM

Basic MLL inverters 200a, 200b and 300a (FIGS. 2a, 2b and 3a, respectively) can be manufactured so that they permanently store mask-programmed data which can be retrieved by first recalling, then propagating the chain of stored data bits (microcode) in a clocked serial shift register fashion. Mask programmed microcode can be applied to any of the serial memory organizations shown in FIGS. 5a, 5b and 5c. The permanent programming feature is achieved by altering (raising) the threshold voltage of the transfer transistor 203 (FIGS. 2e and 2f) or 303 (FIG. 3e) in selected inverter stages along the chain. Raising of the 203 transistor threshold can be achieved, for example, by ion implantation through openings in a programming mask of boron impurities (shown as 241 in FIG. 2e) after formation of gate electrode 216 but prior to deposition of the second electrode 217. Implanted inverter stages have their transfer transistor threshold voltage increased from typically $+1.0V$ to typically $+3.0$ to $+4.0$ V, but in any case at least several tenths of a volt below the $V_{cc}$ voltage of the clock $\phi_{2a}$, $\phi_{2b}$ (or $\phi_{2a}$, $\phi_{2b}$) applied during normal clocking operation. Inverter stages with the high transfer threshold voltage represent a high (H) data state and unimplanted inverters with the unshifted threshold voltage represent a low (L) data state.

Principle of operation of a serial ROM/MLM can be explained by examining, for example, the two inverter stages 300a in FIG. 3e, which are part of a larger chain such as that shown schematically in FIG. 5a. In order to recall the data stored by virtue of high or low thresholds on transistor 303 all electrodes 316 must first be charged to their high state. This is achieved by simultaneously clocking *all* electrodes 317 through their charge-pump phases $t_1$ and $t_2$ (see FIG. 3d). Note that this is different from the normal clocking operation where only alternate electrodes 317 are clocked at any one time.

Next all electrodes 317 are brought up during $t_3$ to a voltage level intermediate between the two threshold voltage stages of transistor 303. For example, this voltage could be $+3.0V$ when the two threshold states on 303 are $+1.0V$ and $+4.0V$. A discharge path to ground through series transistors 301 and 303 then exists for each charged electrode 316 whose 303 transistor is in the low threshold state, but no discharge occurs for those stages whose 303 transistor has the high threshold state and which is therefore not turned on by its corresponding electrode 317. At the end of phase $t_3$ then, when all 317 electrodes are back at zero volts, the information contained in the chain of inverters by virtue of 303 thresholds has been recalled and now appears in the form of charged or discharged electrodes 316. This is the same form of data as exists in the regular (non-ROM) serial MLM described earlier, and it is now possible to shift the data towards $V_{out}$. This is done in identical fashion to that described previously in the section on clocking for serial memory transfers (FIG. 4 and Table I). This is so because during normal serial data propagation the clock phases $\phi_{1a,1b}$ or $\phi_{2a,2b}$ applied through electrodes 317 are taken during their $t_3$ period to a voltage $V_{cc}$ which is higher than even the high threshold voltage state of transfer transistor 303, and therefore each such device 303 can perform its transfer function in either of its two possible ROM threshold voltage states. The serial ROM/MLM shift register can in fact be used as a regular (non-ROM) serial MLM storing new data different from the ROM data with the ROM data available for instantaneous ROM recall (which then displaces any other circulating data in the serial chain) by taking the clock lines $\phi_{1a,1b}$ and $\phi_{2a,2b}$ through the recall cycle.

It should be noted that because the two phase clocking scheme requires two inverter stages per bit storage, the mask ROM programming should implant two successive transfer gates for each bit of ROM data. For an $N+1$ phase clocking scheme, N ROM bits can be stored on $N+1$ inverter stages changing (or leaving unchanged) the threshold of up to N of the $N+1$ transfer gates.

The ROM/MLM concept is useful for storing software for a microcode instruction set, or, for example, for comparing (correlating) an inputted stream of data bits with a set of stored serial patterns such as words in a dictionary. An inputted N bit long word can then be compared with any and all of the ROM stored words by having both propagate with the same clock phases $\phi_{1a,1b}$, $\phi_{2a,2b}$ through a logic summing point (exclusive or) which compares bit by bit each of the bits in the two data streams and determines which, if any, of the ROM stored words has an identical pattern to the input data stream.

There are many other digital filtering applications, including digital delay lines, which can be implemented by combining regular MLL serial shift register chains, ROM/MLL serial shift register chains, and MLL multiple input NAND and NOR gates.

MLL in Digital Optical Detector Arrays

Figure 6:
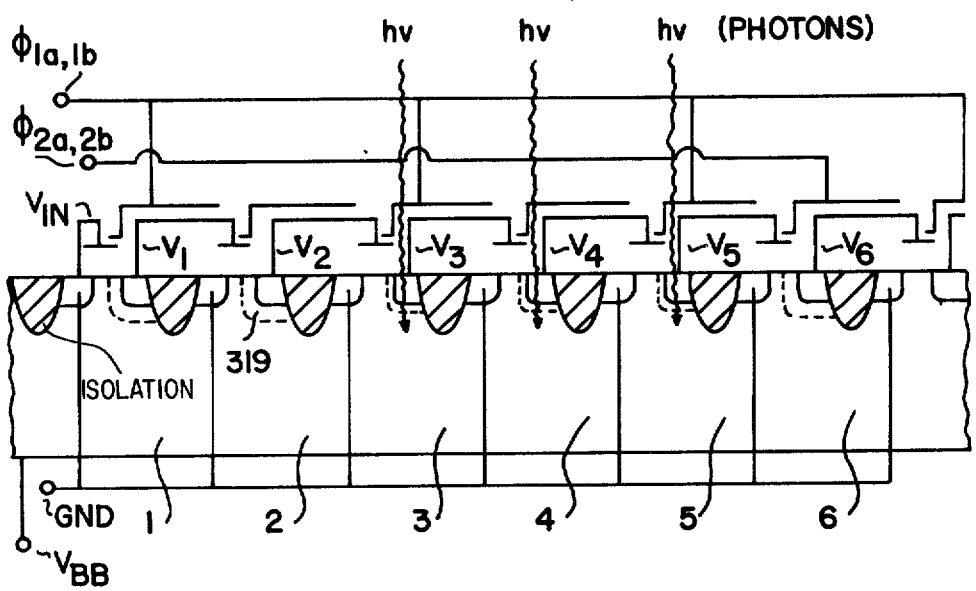
FIG. 6 is a schematic representation of a serial optical detector chain using MLL inverter for the basic detector/shift register elements.

Serial MLL arrays can be made to operate as mosaic digital optical detector arrays for pattern recognition. Simple applications include character recognition but more sophisticated visible and infrared applications are possible. The detector array is identical in construction to any of the serial MLM arrays described previously, such as the arrays shown schematically in FIGS. 5a, 5b and 5c. The principle of operation of an MLL array as an optical detector array requires simply a different clocking sequence than for serial shift-register operation. Collection of the optical data is performed with a clocking scheme very similar to the "recall" clocking sequence employed in ROM/MLM arrays described in the previous section. Although all three cell types 200a, 200b and 300a (FIGS. 2a, 2b and 3a) can be used as optical detector elements, cell 300a has the highest density and simplest clocking requirements, and therefore will be the one described here. An array such as the serial shift register chain of FIG. 6 has two different clock cycles—the first for collecting the optical image information and converting it to digital (binary) form and the second for serially propagating this data out of the array. In order to illustrate the principle of operation, consider a chain of six MLL inverters of the type shown in FIG. 3e (cell 300a). The six cells are shown schematically with their clock lines in FIG. 6. For the purpose of imaging applications the $V_{in}$ electrode is permanently tied to ground. For the purpose of this illustration suppose that incident light (photons) is incident on cells 3, 4, and 5, but not on cells 1, 2, and 6. Table II shows the chain of events resulting in detecting and then shifting this optical pattern out of the serial chain.

During event #1 (precharge) all clock lines are simultaneously taken through periods $t_1$ and $t_2$ (see FIG. 3d), the charge pumping sequence. This results in precharging all electrodes $V_i$ (316) to their high (H) state, clearing whatever prior data exists in the inverter chain.

Event #2 (integrate) is the light integration period during which the incident photons are collected by absorption on electrode 316 or in the space charge regions of junctions 319 (shown by dotted lines in FIG. 6) where they are incident. These photons generate electrons in the space charge region which are collected and reduce the excess holes stored on electrodes 316. Areas of the array where the incident photon flux is high will have electrodes 316 quickly discharged to the low (L) state during the integration period while areas with sufficiently low incident flux will remain essentially undischarged at the H state at the end of the integration period.

If the incident illumination from the image is too high, then the integration period can be shortened, much like the shutter speed of a camera. In fact, a series of varying contrast images can be obtained by obtaining a set of successive frames of the same image, each frame representing a slightly different integration period. Alternatively, the contrast in the image, which is essentially dictated by the cutoff between the H and L states for each pixel, can be controlled for cells of type 300a by the DC voltage on $V_{BB}$, since this voltage directly determines how much excess charge is stored on electrodes 316 at the beginning of each integration period (i.e., at the completion of each charge pump period). The voltage on $V_{BB}$ can also be substantially increased (made more negative) during the integration period only, to increase the imaging sensitivity by inducing avalanche multiplication for each electron-hole pair generated from an incident photon. At the completion of the charge integration period the array has a pattern of H and L states corresponding to the image viewed. This pattern can now be serially shifted out of the array using the regular $\phi_{1a,1b}$ and $\phi_{2a,2b}$ clock phases at a clock period considerably shorter than the integration period. Typically the light integration period is of the order of 0.1 to 1.0 millisecond whereas the propagation clock period is on the order of 0.1 to 1.0 microsecond. Because the serially propagated data is completely refreshed with each transfer clock cycle, any partial loss of signal due to neutralization of charge on electrodes 316 by incident light during th transfer is not important since it is entirely made up for in the charge-pump phase of the next clock cycle. This is an important advantage over prior art CCD imagers, for which the image must be entirely blanked out during the time the integrated signal in propagated out of the imaging array. For very low light intensity applications requiring low noise and long integration periods the array can be cooled to reduce the thermal generation currents in the array.

Another very significant advantage of the MLL serial optical detector is that the signal collected at each space charge region 319 is locally amplified by the transistor action on gate electrode 316, i.e., a very small number of collected photons can change the conduction state of the 301 transistor of the next stage in the serial chain by reducing its $V_i$ from several tenths of a volt above the threshold voltage to just below it.

During event #3 (clear) the array must be prepared for beginning to shift the collected data out of the array. This is achieved by taking either the $\phi_{1a,1b}$ or the $\phi_{2a,2b}$ clock line (but only one of the two) through its $t_3$ state (FIG. 3d), which clears out the information just collected in every second inverter stage in the chain. The reason for this is that only one bit of data can be stored on or propagated through two inverter stages with the two-phase clocking scheme. (It was shown above that an N+1 phase clocking scheme can store N bits on N+1 inverter stages, in which case better image resolution is obtained at a penalty in frequency of data-out rate.) This loss of information is not severe for most applications because of the physical close proximity of inverter stages in the array, which implies a sufficiently good resolution even if only one in every two detector elements delivers a usable signal. In Table II the $\phi_{2a,2b}$ clock is used to clear all even electrodes $V_2$, $V_4$, $V_6$ so that each now reflects the information stored on the preceding inverter stage, $V_1$, $V_3$ and $V_5$, respectively.

Event #4 ($\phi_{1a,1b}$ taken through all its phases $t_0$, $t_1$, $t_2$, $t_3$) is the beginning of the data shifting cycles. It, as well as events 5 through 9 are identical to the data shifting operation described earlier in detail with regard to the serial shift register in FIG. 4 and Table I. These events can be followed in Table II which shows that the optical data is collected in digital binary form at the $V_{out}$ terminal. At the end of event #9 all the optical data is shifted out of the array and it is ready for beginning a new precharge cycle (event #1) for a new frame. Typically in a large detector array such as the SPS array of FIG. 5b a new frame of the image viewed can be attained every 1-10 milliseconds.

It is clear from the above discussion that the digital optical detector can be readily integrated on the same chip with other logic elements, including serial MLM, ROM/MLM, NAND and NOR gates as well as static logic elements, thus comprising an integrated optical signal processor. Such a processor chip can be useful in many telecommunication and xerography applications.

Figure 7A:
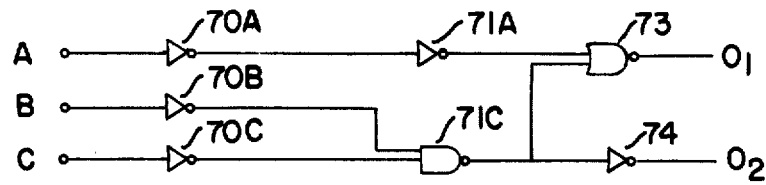
FIGS. 7a and 7b illustrate a logic diagram and silicon implementation of a logic structure constructed in accordance with this invention.
Figure 7B:
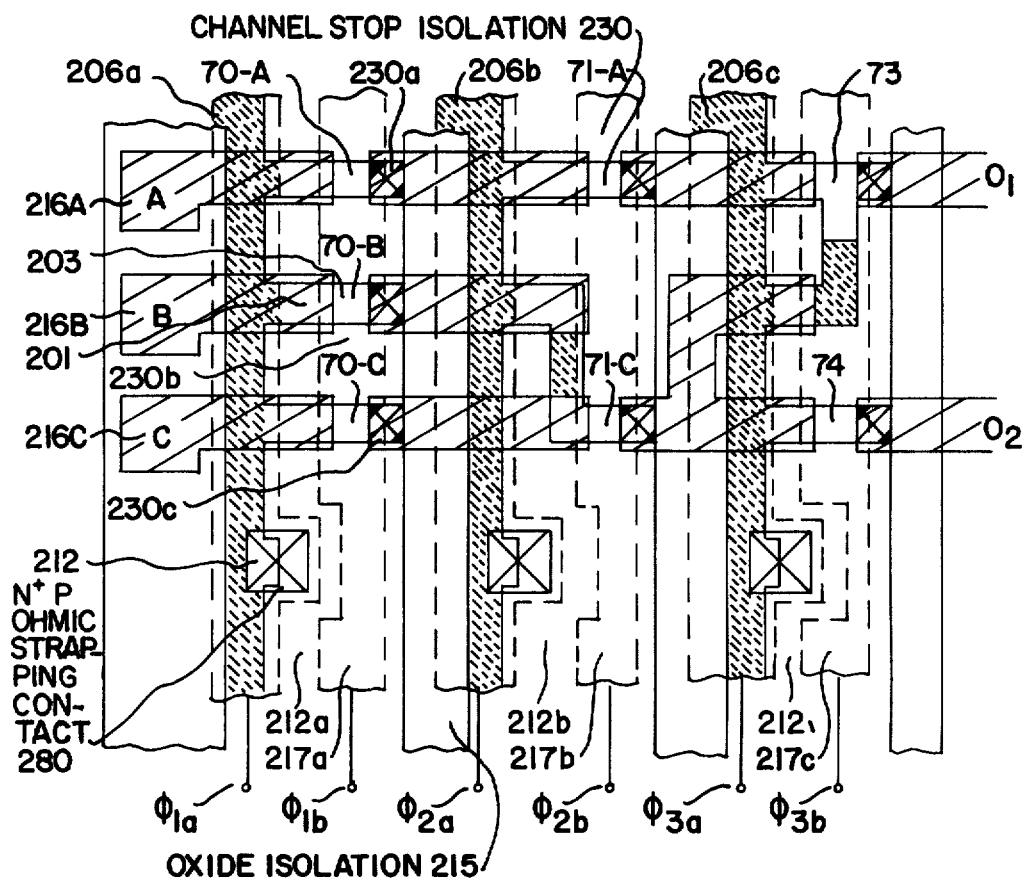

FIG. 7a illustrates a typical logic structure containing inverters, NAND gates and NOR gates implemented using the merged load logic of this invention. FIG. 7b illustrates in plan view the layout in silicon which achieves the logical functions illustrated in FIG. 7a. The structure illustrated in FIG. 7b is not the only possible implementation of the logic shown in FIG. 7a but is one convenient implementation of this logic. Thus in FIG. 7a, three input nodes, nodes A, B and C, are connected to the input leads of inverters 70A, 70B and 70C, respectively. The output signal from inverter 70A is transmitted to inverter 71A. The output signals from inverters 70B and 70C are transmitted to the two input leads of NAND gate 71C. The output signal from NAND gate 71C is transmitted to the input lead of inverter 74 and to one of the two input leads of NOR gate 73. The other input lead to NOR gate 73 is connected to the output lead from inverter 71A. The output signals $O_1$ and $O_2$ from the logical circuit are taken from the output leads of NOR gate 73 and inverter 74, respectively.

The semiconductor implementation of the abovedescribed structure is quite straight-forward in accordance with the principles of this invention. As shown in FIG. 7b, input leads A, B and C comprise contacts 216A, 216B and 216C, respectively. These contacts are transmitted to the input leads of inverters 70A, 70B and 70C, respectively. These inverters comprise the merged logic load structure of the tpe described above in, for example, FIG. 2e. Thus in FIG 7b, the $\phi_{1a}$ line illustrated in plan view as source diffusion 206 corresponds to N+ source diffusion 206 shown in cross-section in FIG. 2e. Contact 280 comprises an ohmic strapping contact to N+ source 206 and P substrate 212. A contact such as contact 280 is made to regions 206 and 212 every K row of inverters along the strip diffusion 206 and 212, where K is a selected integer typically, but not necessarily, comprising 8 or 16. The $\phi_{1b}$ gate is illustrated as being formed from metal (dashed lines) and corresponds to the gate 217a shown in cross-section in FIG. 2e. Clocking line 217a is located partially above the buried contact 230a corresponding to inverter 70a, buried contact 230b corresponding to inverter 70B and buried contact 230c corresponding to inverter 70C. A conductive gate corresponding to conductive gate 216 extends from the buried contact over oxide isolation 215 to overlie on gate oxide a portion of the channel region in the inverter in the next adjacent column.

The structure shown in row 216A is a typical inverter structure with two inverters in series comprising inverter 70A and inverter 71A. The second column comprising P-type region 212b and source region 206b and clocking gate 217b associated with the rows attached to contacts 216B and 216C illustrates the unique versatility associated with the logic structure of this invention. Thus the portion of the conductive gate 216B (FIGS. 2e and 7b) which extends over the P-region 212b in the row 216B will result in a conductive channel forming beneath that gate when the charge on the conductive gate is above a selected magnitude. Thus the charge on the drain on thet drain associated with inverter 71C will be depleted to ground 206b, if a channel is formed beneath the conductive gate associated with inverter 70C. If either one of the conductive gates does not have a channel formed beneath it, then the charge on the drain associated with inverter 71C will not be depleted when gate 217b is brought to a high potential during clock phase $\phi_{2b}$. This structure thus implements a standard NAND function.

The NOR gate 73 is implemented in a similar manner except that the drain region associated with inverter 73 will be discharged when either of the conductive gates controlling the current paths from ground (source drain diffusion 206C) to this drain region are charged above the channel threshold voltage. Inverter 74 functions in the standard manner as described above in conjunction with the structure shown in FIG. 2e.

In the structure shown in FIGS. 7a and 7b, the data is made to propagate through successive stages of the device by controlling the phases of the clock signals applied to the $\phi_{1a}$, $\phi_{1b}$, $\phi_{2a}$, $\phi_{2b}$ and $\phi_{3a}$, $\phi_{3b}$ leads as shown, for example, in FIG. 2d.

Other embodiments of this invention will be obvious to those skilled in the semiconductor arts in view of the above description.

I claim:

1. A dynamic logic element formed in semiconductor material comprising:
    a semiconductor substrate of a first conductivity type;
    a first region of second conductivity type formed in said substrate with a first PN junction formed between said first region and said substrate;
    means for reverse biasing said first PN junction thereby to electrically isolate said first region from said substrate;
    an MOS transistor with source and drain each of said first conductivity type formed in said first region with a second PN junction formed between said drain and said first region, said first region containing a channel region between said source and drain;
    a bipolar load transistor possessing an emitter, a base and a collector, said emitter also comprising the drain of said MOS transistor, said base comprising said first region and said collector being disposed vertically below said MOS transistor in said semiconductor substrate;
    insulation formed over said channel region;
    a plurality of gates formed above said channel region on said insulation, each gate controlling the conductivity of a corresponding portion of said channel region underlying said gate so that the entire length of said channel can be controlled by said plurality of gates and at least one of said gates providing an input terminal for carrying an input signal to said logic element;
    means for conducting charge, said means for conducting being in electrical contact with said drain-emitter region and forming an output terminal for said logic element;
    means for applying signals to each of said plurality of gates, to said source region of said MOS transistor and to the base of said bipolar transistor, said means for applying signals including means for applying a first clock signal during a first time interval to the base of said bipolar transistor and means for applying a second clock signal during a second time interval to at least one of said plurality of gates, said first clock signal tending to leave the junction between said base and said emitter reverse biased during said second time interval following said first time interval, said second clock signal tending to induce an inversion layer in said first region under said at least one of said plurality of gates during said second time interval;
    means for applying a selected potential to said collector of said bipolar transistor.

2. Structure as in claim 1 wherein a selected one of said plurality of gates overlies a portion of said means for conducting charge.

3. Structure as in claim 1 wherein said means for conducting extends on insulation to a second logic element located adjacent to said logic element and comprises one of a plurality of gates above the channel region of the MOS transistor in said second logic element.

4. Structure as in claim 2 wherein said means for applying clock signals to said source region and said base region comprises:
    means for controlling the potential of said source and said base to be substantially identical.

5. Structure as in claim 2 wherein said plurality of gates comprises two gates, a first gate being an input gate driven by a selected input signal and a second gate being a clock gate driven by a selected clock signal.

6. A plurality of dynamic logic elements arranged in a series, wherein each logic element comprises:
    a semiconductor substrate of first conductivity type;
    a first region of second conductivity type formed in said substrate with a first PN junction formed between said first region and said substrate;
    means for reverse biasing said first PN junction thereby to electrically isolate said first region from said substrate;
    an MOS transistor with a source region and a drain region each of said first conductivity type formed in said first region with a channel region formed in said first region between said source and said drain;
    a bipolar load transistor containing an emitter comprising the same region as said drain, a base comprising the same region as said first region and a collector comprising said substrate;

insulation formed above said channel region;

a plurality of gates in series on said insulation above said channel region, each gate being electrically isolated from the adjacent gate or gates and each gate controlling a corresponding portion of the underlying channel region so that the entire length of said channel can be controlled by said plurality of gates;

means, in electrical contact with said drain-emitter region, for conducting, said means for conducting extending on insulation from said drain-emitter region of said logic element to insulation overlying a portion of the channel region of the next following logic element; the first logic element in said series containing as one of said plurality of gates an input gate connected to a source of an input signal, and the last logic element in said series having its said means for conducting connected to an output circuit; and means for applying clock signals of at least four phases to said plurality of dynamic logic elements arranged in series wherein the first phase of the clock signal is applied to the source and the first region of each of the odd-numbered logic elements in said series of logic elements, the second clock phase is applied to a selected one of said plurality of gates in each of the odd-numbered logic elements in said series of logic elements, said selected one of said plurality of gates comprising a clocking gate; said third clock signal being applied to the source and the first region of each of the even-numbered logic elements in said series of logic elements and said fourth clock signal being applied to a selected one of the plurality of gates in each of said even-numbered logic elements in said series of logic elements, said selected one of said plurality of gates comprising a clocking gate, wherein the input signal on the input gate associated with each of the odd-numbered logic elements in the series of logic elements is propagated one logic element stage along said series of dynamic logic elements with each complete clocking cycle comprising said four clocking signals.

7. Structure comprising:

an MOS transistor formed in a semiconductor substrate of a first conductivity type with a source region and a drain region each of second conductivity type formed in said substrate so as to form PN junctions between said source region and said substrate and said drain region and said substrate, said source region and said drain region being separated from each other by a channel region formed in said substrate;

insulation formed over said channel region;

a plurality of gates formed on said insulation, each gate being electrically isolated from the adjacent gate or gates and overlying a portion of the underlying channel region so that the entire length of said channel region can be controlled by said plurality of gate;

means for applying a multiplicity of selected potentials to each of said plurality of gates;

means for conducting charge, said means for conducting charge being formed so as to contact a portion of said drain;

dielectric material overlying one surface of said means for conducting charge; and a selected one of said plurality of gates being formed on said dielectric over at least a portion of said means for conducting charge so as to enhance capacitive coupling between said one of said plurality of gates and said means for conducting charge; said selected one of said plurality of gates serving to precharge said means for conducting charge during a first clock phase and to allow discharge of said means for conducting charge during a second clock phase.

8. Structure as in claim 7 including:

means for applying a first selected potential to said substrate;

means for applying a second selected potential to said selected one of said plurality of gates during a precharge time period, said second selected potential being selected to drive the potential on said selected one of said plurality of gates with respect to the potential on said substrate thereby to capacitively forward bias the PN junction formed between said drain region and said substrate and to allow charge to flow into said drain region and onto said means for conducting charge, and, at the termination of said precharge time period for changing the potential on said selected one of said plurality of gates in a direction tending to reverse bias the drain to substrate PN junction thereby to trap charge on said means for conducting charge during a standby time period following said precharged time period when said PN junction between said drain region and said substrate becomes reverse biased;

means for applying a third selected potential to said selected one of said plurality of gates during a discharge time period following said standby time period of such magnitude and polarity with respect to the substrate to form a conductive channel in said channel region beneath that portion of said selected one of said plurality of gates overlying the channel; and means for applying a fourth selected potential to the other of said plurality of gates during said discharge time period, thereby to control the conductivity of said portion of the channel region beneath said other of said plurality of gates simultaneously with the formation of the channel region beneath the selected one of said plurality of gates, said charge on said means for conducting charge flowing to said source region when said other of said plurality of gates has a sufficient potential to form a channel region completely from said drain region to said source region and said charge on said means for conducting charge remaining on said means for conducting charge when the potential on said other of said plurality of gates is not sufficient to form a channel region from said source region to said drain region, said source region being held at selected potential.

9. Structure as in claim 8 wherein said means for conducting charge extends on insulation over a channel of an adjacent second structure otherwise identical to said structure thereby forming the input gate of said second identical structure.

10. Structure as in claim 7 wherein said selected one of said plurality of gates overlying a portion of said means for conducting charge is separated therefrom by dielectric material of a thickness such that the capacitance between said selected one of said plurality of gates and said means for conducting charge is substantially greater than the capacitance between said means for conducting charge, said drain region and the underlying substrate, and the capacitance between said means for conducting charge and the channel region of the next following MOS transistor.

11. Structure as in claim 10 wherein the capacitance between said selected one of said plurality of gates and said underlying means for conducting charge is at least twice the capacitance between said means for conducting charge and any other portion of active semiconductor material.

12. Structure as in claim 1 wherein the threshold voltage of a portion of said channel region underneath a selected one of said plurality of gates has been modified by changing the dopant concentration of said portion of said channel region thereby to insure that said means for conducting is not connected by a channel to said source when the potential on said selected gate above said portion of said channel region is raised to a first selected value, but is capable of losing said charge when said potential on said selected gate is raised to a second higher selected value.

13. Structure as in claim 2 wherein the threshold voltage of a portion of said channel region underneath the selected one of said plurality of gates has been modified by changing the dopant concentration of said portion of said channel region thereby to insure that said means for conducting is not connected by a channel to said source when the potential on said selected gate above said portion of said channel region is raised to a first selected value, but is capable of losing said charge when said potential on said selected gate is raised to a second higher selected value.

14. Structure comprising:
a plurality of logic elements connected in series, each logic element comprising:
an MOS transistor with a source region and drain region each of a first conductivity type formed in a substrate of a second conductivity type, with a channel region formed in said substrate between said source region and drain region and with PN junction formed between said source region and said substrate and between said drain region and said substrate;
insulation formed over said channel region;
a plurality of conductive gates formed above said channel region, each gate being electrically insulated from, but being arranged relative to the others of said plurality of conductive gates so that the conductivity of the entire length of said channel region can be controlled by said plurality of conductive gates;
means for conducting charge, said means for conducting charge being in electrical contact with said drain region;
at least one of said plurality of conductive gates comprising an input gate covering a portion of said channel region and a second of said plurality of conducting gates comprising an electrode which extends on insulation over at least a portion of said means for conducting charge, thereby causing said second of said plurality of conductive gates to be capacitively coupled to said means for conducting charge; and the first of said logic elements having said input gate connected to a source of an input signal and the last of said logic elements having said means for conducting charge connected to an output circuit; and
means for applying clocking potentials of at least four phases in a clock cycle to said second of said plurality of conducting gates, the first clock potential in said clock cycle being applied to each of said second of said plurality of conducting gates in the odd logic elements in the series of logic elements; the second clock potential being applied to each of said second of said plurality of conducting gates in the odd elements in said series of logic elements at a second time; the third clock potential being applied to said second of said plurality of conducting gates in each of the even-numbered logic elements in said series of logic elements during a third time period and the fourth clocking potential being applied to said second of said plurality of conducting gates in each of said even-numbered logic elements in said series of logic elements during a fourth time interval, thereby to cause the input signal on the input gate of each of the odd-numbered logic elements to propagate from the corresponding odd-numbered logic element to the next higher odd-numbered logic element in one complete clock cycle.

15. Structure comprising:
a plurality of cells connected in series, each cell comprising:
an MOS transistor with a source region and drain region, each of a first conductivity type formed in a substrate of a second conductivity type, with a channel region formed in said substrate between said source region and drain region and with a PN junction formed between said source region and said substrate in between said drain region and said substrate;
insulation formed over said channel region;
a plurality of conductive gates formed above said channel region, each gate being electrically insulated from, but being arranged relative to the others of said plurality of conductive gates so that the conductivity of the entire length of said channel region can be controlled by said plurality of conductive gates;
means for conducting charge, said means for conducting charge being an electrical contact with said drain region;
at least one of said plurality of conductive gates comprising an input gate covering a portion of said channel region and a second of said plurality of conducting gates comprising an electrode which extends on insulation over at least a portion of said means for conducting charge, thereby causing said second of said plurality of conductive gates to be capacitively coupled to said means for conducting charge, wherein the input gate in the first cell in said series of cells is connected to a selected potential, the input gate in each of the other cells subsequent to the first of said series of cells comprises the means for conducting charge in electrical contact with the drain region of the previous cell and extending over insulation between the previous cell to the given cell, thereby to control a portion of the channel region between the source region of the given cell and the drain region of said given cell, and wherein the means for conducting charge extending from the drain region of the last cell in said series of cells comprises an output lead from said series of cells; and wherein said PN junction formed between said drain region and said substrate in each cell which isolates said drain region from all other drain regions contains a space-charge region susceptible to the generation of hole-electron pairs in response to incident radiation and wherein said structure includes:

means for applying a selected potential to said substrate;

means for causing said means for conducting charge to accumulate charge during a precharge time period;

means for allowing radiation to be incident upon said PN junction formed between said drain region and said substrate for a second predetermined integration time following said first precharge time, thereby to modify the charge on said means for conducting charge in proportion to the total integral of the radiation incident on said space-charge region, the charge on said means for conducting charge forming an optical image; and means for shifting a signal representative of the charge stored on said means for conducting charge associated with a given cell from said structure during a third predetermined time following said second predetermined integration time; wherein said third predetermined time is less than said second predetermined time.

16. Structure as in claim 15 wherein each of said logic elements includes a PN junction found between said drain region and said substrate which isolates said drain region from all other drain regions, said PN junction containing a space charge region susceptible to the generation of hole-electron pairs in response to incident radiation, wherein said incident radiation results in any pre-stored charge or said means for conducting charge being modified in proportion to the total integral of the radiation incident upon said space charge region.

17. Structure as in claim 15 including means for changing the contrast of the optical image produced by the total integral of the light incident upon each space-charge region by changing the substrate potential while maintaining constant the second predetermined integration time.

18. Structure as in claim 15 including means for increasing the sensitivity of the logic element to incident light during said second predetermined integration time by lowering the substrate voltage to obtain avalanche multiplication in said space charge region in response to incident light.

19. Structure as in claim 17 or 18 including means for transferring digital signals representing the light incident upon selected ones of said space charge regions to a selected output lead at a first selected clock frequency.

20. A plurality of inverters formed in series in semiconductor material wherein each inverter is electrically isolated from each of the other inverters in series, and wherein each inverter comprises:

an MOS transistor with source and drain formed in a semiconductor substrate; said substrate containing a channel region between said source and drain and PN junctions between said source and said substrate and between said drain and said substrate;

a bipolar load transistor possessing an emitter, a base and a collector, said emitter also comprising the drain of said MOS transistor, said base comprising the substrate of said MOS transistor and said collector being separated from said substrate of said MOS transistor by a PN junction, wherein said PN junction is back-biased and serves to isolate said MOS transistor from each of the other MOS transistors in said plurality of inverters;

insulation formed over said channel region;

a plurality of gates formed above said channel region on said insulation, each gate controlling the conductivity of a corresponding portion of said channel region underlying said gate;

means for conducting charge, said means for conducting being in electrical contact with said drain-emitter region; and means for applying as a function of time selected potentials to each of said plurality of gates, to said source region of said MOS transistor, to the base of said bipolar transistor and to the collector of said bipolar transistor, thereby to forward bias said PN junction between said drain and said substrate during a first time period to store a selected charge on said means for conducting charge and to reverse bias said PN junction between said drain and said substrate at the end of said first selected time period and then to form a conductive inversion layer in said channel between said drain and said source during a second time period following said first time period, said charge on said means for conducting charge draining to said source when all of said plurality of gates contain a first level of charge sufficient to form an inversion channel completely between said source and said drain, and said charge on said means for conducting charge remaining when one or more of said plurality of gates contains a level of charge insufficient to form an inversion channel completely between said source and drain, wherein said drain-emitter region and said means for conducting charge are junction isolated from all other such drain-emitter regions and means for conducting charge in electrical contact therewith in adjacent transistors.

21. Structure as in claim 20 wherein said drain-emitter region is junction isolated from the drain-emitter regions of all other MOS transistors formed in said semiconductor material and wherein said source and base regions are common with a selected number of other such MOS transistors, and wherein said collector is common to all such MOS transistors in the array.

22. Structure as in claim 21 wherein said means for conducting charge associated with each of a selected number of said plurality of inverters in series extends on insulation to the next following inverter and comprises one of said plurality of gates above the channel region of the MOS transistor in said next following inverter.

23. Structure as in claim 1 wherein said plurality of gates comprises three gates in series, a first gate driven by a first selected input signal, a second gate driven by a second selected input signal and a third gate driven by a selected clock signal, wherein said first and second gates must both be driven to a selected high potential in order for said channel region to conduct.

24. Structure as in claim 1 wherein said plurality of gates comprise three gates, a first gate driven by a first selected input signal in parallel with a second gate driven by a second selected input signal and a third gate driven by a selected clock signal, wherein either said first or said second or both said first and said second gates must be driven to a selected high potential in order for said channel region to conduct.

25. An array of inverters wherein said array comprises a plurality of M columns and N rows of inverters where M and N are selected integers, each of said N rows comprising a plurality of M inverters arranged in a series and wherein each of said M columns comprises a multiplicity of N inverters arranged in a column, wherein each inverter comprises the structure of claim 1 and wherein each of the inverters in a selected column shares its source and base diffusions with the other inverters in said selected column but have drain-emitter regions extending over a second portion of said channel region between said source and said drain, said channel region conducting when either said first or said second gate has a selected potential above the potential on said substrate applied to it.

26. An array of MOS transistors wherein each MOS transistor comprises the transistor recited in claim 7 and wherein the drain region of each MOS transistor is junction isolated from the drains of other adjacent MOS transistors.

27. Structure as in claim 8 including means for raising the voltage on the substrate of said MOS transistor thereby to reduce the magnitude of charge pumped onto said means for conducting electrons during the time said selected one of said plurality of gates is driven beneath the potential on said substrate.

28. Structure as in claim 8 where said plurality of gates formed on said insulation, each gate being electrically isolated from the adjacent gate or gates and overlying a portion of the underlying channel region comprises a first gate formed on said insulation to overlie a first selected portion of the underlying channel region and a second gate formed on said insulation, said second gate being formed to overlie a second portion of the underlying channel region, and a third gate formed on said insulation, said first gate and said second gate being arranged so that said channel region is capable of conducting only when said first gate and said second gate have a selected potential above the potential on said substrate.

29. Structure as in claim 8 wherein said plurality of gates formed on said insulation, each gate being electrically isolated from the adjacent gate or gates and overlying a portion of the underlying channel region, comprises a first gate and a second gate, said first gate extending over a first portion of the channel region between said source and said drain and said second gate extending over a second portion of said channel region between said source and said drain, said channel region conducting when either said first or said second gate has a selected potential above the potential on said substrate applied to it.

30. An array of inverting cells comprising M rows and N columns wherein each of said M rows comprises a plurality of inverting cells connected in series as recited in claim 13, and wherein each of the plurality of M MOS transistors in a given column has a source diffusion shared with each of the other (M-1) transistors in said column.

31. Structure as in claim 5 including:
means for maintaining said collector at a first selected voltage level;
means for driving said first gate to a second selected voltage level in response to an input signal;
means for driving both said source and said first region momentarily from ground voltage to a third selected voltage above ground voltage, said third selected voltage being selected to switch on said bipolar load transistor so as to place a selected charge on said means for conducting charge, and for returning said source and said first region to ground voltage at the end of a selected time;
means for driving said clock gate to a fourth selected voltage after the end of said selected time, said fourth selected voltage being sufficient to invert the portion of the channel region underlying said clock gate thereby to allow any charge previously placed on said means for conducting charge to flow to said source when said input signal on said input gate is at a first voltage level sufficient to invert the portion of the channel region underlying said input gate and not to flow to said source when said input signal on said input gate is at a second voltage not sufficient to invert the portion of the channel region underlying said input gate.

32. The structure of claim 6 including means for logically manipulating said input signal with other logic signals applied to said plurality of gates at selected stages of said series of logic elements.

33. Structure as in claim 32 including means for clocking said other logic signals along other of said series of dynamic logic elements with the same clock frequency as that for said input signal.

34. The structure of claim 14 including means for logically manipulating said input signal with other logic signals applied to said plurality of conductive gates at selected stages of said series of logic elements.

35. Structure as in claim 34 including means for clocking said other logic signals along other of said series of dynamic logic elements with the same clock frequency as that for said input signal.

36. Structure as in claim 6 wherein said plurality of gates on said insulation above said channel region in each of a selected number of said MOS transistors in said plurality of logic elements arranged in a series comprises at least two portions of the means for conducting charge each extending from a preceding logic element and arranged so that said channel conducts when both of said at least two portions of the means for conducting charge overlying a portion of the channel region of said logic element contain a selected charge.

37. Structure as in claim 14 wherein said plurality of gates on said insulation above said channel region in each of a selected number of said MOS transistors in said plurality of logic elements arranged in a series comprises at least two portions of the means for conducting charge each extending from a preceding logic element and arranged so that said channel conducts when both of said at least two portions of the means for conducting charge overlying a portion of the channel region of said logic element contain a selected charge.

38. Structure as in claim 37 wherein said structure comprises a NAND gate.

39. Structure as in claim 37 wherein said at least two portions of the means for conducting charge each extending from a preceding logic element are arranged so that said channel conducts when either one of said at least two portions of the means for conducting charge overlying a portion of the channel region of said logic element contains a selected charge.

40. Structure as in claim 36 wherein said structure comprises a NAND gate.

41. Structure as in claim 39 wherein said structure comprises a NOR gate.

* * * * *